(12) United States Patent
Hung et al.

(10) Patent No.: US 10,658,319 B2
(45) Date of Patent: May 19, 2020

(54) SEMICONDUCTOR DEVICES AND SEMICONDUCTOR PACKAGES

(71) Applicant: Advanced Semiconductor Engineering, Inc., Kaohsiung (TW)

(72) Inventors: Chih-Pin Hung, Kaohsiung (TW);
Dao-Long Chen, Kaohsiung (TW);
Ying-Ta Chiu, Kaohsiung (TW);
Ping-Feng Yang, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 16/247,437

(22) Filed: Jan. 14, 2019

(65) Prior Publication Data
US 2019/0148326 A1    May 16, 2019

Related U.S. Application Data

(63) Continuation of application No. 15/076,831, filed on Mar. 22, 2016, now Pat. No. 10,181,448.

(51) Int. Cl.
*H01L 23/00*    (2006.01)

(52) U.S. Cl.
CPC ............. *H01L 24/13* (2013.01); *H01L 24/05* (2013.01); *H01L 24/11* (2013.01); *H01L 24/16* (2013.01); *H01L 24/81* (2013.01); *H01L 2224/0401* (2013.01); *H01L 2224/1161* (2013.01); *H01L 2224/11622* (2013.01); *H01L 2224/131* (2013.01); *H01L 2224/13012* (2013.01); *H01L 2224/13015* (2013.01); *H01L 2224/13017* (2013.01); *H01L 2224/13018* (2013.01); *H01L 2224/13082* (2013.01); *H01L 2224/13083* (2013.01); *H01L 2224/16145* (2013.01); *H01L 2224/16227* (2013.01); *H01L 2224/81385* (2013.01); *H01L 2224/81815* (2013.01)

(58) Field of Classification Search
None
See application file for complete search history.

(56) References Cited

U.S. PATENT DOCUMENTS

| 2012/0273934 A1 | 11/2012 | Shieh et al. |
| 2013/0026619 A1 | 1/2013 | Chang et al. |
| 2013/0062755 A1 | 3/2013 | Kuo et al. |

(Continued)

OTHER PUBLICATIONS

Notice of Allowance for U.S. Appl. No. 15/076,831, dated Sep. 6, 2018, 8 pages.

(Continued)

*Primary Examiner* — Steven B Gauthier
(74) *Attorney, Agent, or Firm* — Foley & Lardner LLP

(57) ABSTRACT

A semiconductor device includes a semiconductor element, a trace disposed adjacent to a surface of the semiconductor element, a bonding pad disposed adjacent to the surface of the semiconductor element and connected to the trace, and a pillar disposed on the bonding pad. The pillar includes a first end wall, a second end wall opposite the first end wall, a first side wall, and a second side wall opposite the first side wall. The first side wall and the second side wall connect the first end wall to the second end wall. One or both of the first side wall and the second side wall incline inwardly from the first end wall to the second end wall. The pillar is disposed on the bonding pad such that the first end wall is closer to the trace than is the second end wall.

20 Claims, 15 Drawing Sheets

(56) References Cited

U.S. PATENT DOCUMENTS

2013/0256878 A1 10/2013 Hsu et al.
2015/0021764 A1 1/2015 Paek et al.

OTHER PUBLICATIONS

Non-Final Office Action for U.S. Appl. No. 15/076,831, dated Apr. 5, 2018, 14 pages.
Final Office Action for U.S. Appl. No. 15/076,831, dated Aug. 17, 2017, 12 pages.
Non-Final Office Action for U.S. Appl. No. 15/076,831, dated Mar. 28, 2017, 11 pages.
Non-Final Office Action for U.S. Appl. No. 15/076,831, dated Nov. 21, 2016, 10 pages.

SEMICONDUCTOR DEVICES AND SEMICONDUCTOR PACKAGES

CROSS REFERENCE TO RELATED APPLICATION

This application is a continuation of U.S. patent application Ser. No. 15/076,831, filed on Mar. 22, 2016, the contents of which are incorporated herein by reference in their entireties.

BACKGROUND

1. Technical Field

The present disclosure relates to a semiconductor device and a semiconductor package, and, more particularly, to a semiconductor device including one or more pillar structures and a semiconductor package including the same.

2. Description of the Related Art

In a semiconductor flip-chip bonding process, an upper chip is placed on a lower chip (or a substrate). The upper chip may be electrically connected to the lower chip (or substrate) through metal pillars disposed on the upper chip, and through lower bonding pads disposed on the lower chip. Solder may be used to physically connect the metal pillars and the lower ponding pads.

As a semiconductor device and the metal pillars thereof continue to scale down in size, a current density in the metal pillars increases. The increase in current density results in a current crowding region, which generally occurs in a top region of the metal pillar. The current crowding region results in joule heating that can cause damage to the metal pillar. Therefore, it would be desirable to provide a semiconductor device including a pillar structure and a semiconductor package including the same, to reduce a current crowding region or to reduce joule heating.

SUMMARY

In an aspect, a semiconductor device includes a semiconductor element, a trace disposed adjacent to a surface of the semiconductor element, a bonding pad disposed adjacent to the surface of the semiconductor element and connected to the trace, and a pillar disposed on the bonding pad. The pillar includes a first end wall, a second end wall opposite the first end wall, a first side wall, and a second side wall opposite the first side wall. The first side wall and the second side wall connect the first end wall to the second end wall. One or both of the first side wall and the second side wall incline inwardly from the first end wall to the second end wall. The pillar is disposed on the bonding pad such that the first end wall is closer to the trace than is the second end wall.

In an aspect, a semiconductor device includes a semiconductor element, a trace disposed adjacent to a surface of the semiconductor element, a bonding pad connected to the trace, and a pillar disposed on the bonding pad. The pillar includes a first end adjacent to the trace and a second end away from the trace, and the first end is wider than the second end.

In an aspect, a semiconductor package includes a first semiconductor element and a second semiconductor element. The first semiconductor element includes a first trace, a first bonding pad connected to the first trace, and a pillar disposed on the first bonding pad. The pillar includes a first end wall adjacent to the first trace, a second end wall opposite the first end wall and remote from the first trace, a first side wall, and a second side wall opposite the first side wall. The first side wall and the second side wall connect the first end wall to the second end wall. One or both of the first side wall and the second side wall incline inwardly from the first end wall to the second end wall. The second semiconductor element includes a second trace and a second bonding pad connected to the second trace. The pillar is bonded to the second bonding pad.

DETAILED DESCRIPTION

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

In a semiconductor flip-chip bonding process, an upper chip is placed on a lower chip (or a substrate). The upper chip may be electrically connected to the lower chip (or to a substrate) through metal pillars disposed on the upper chip and through lower bonding pads disposed on the lower chip. Solder is disposed to connect the metal pillars and the lower bonding pads. A reflow process melts the solder so that the metal pillars can bond with the bonding pads, to form a flip-chip bonding structure. However, such bonding structures can be fragile, as current crowding is often generated at a corner portion of a metal pillar that is vertically connected to a bonding pad (or a trace). The current crowding may generate joule heating and thus accumulate heat, which may in turn break the metal pillar or a solder connection, and may further affect the electrical connection. A result may be low reliability.

The semiconductor device of the present disclosure provides for an improved bonding structure with reduced current crowding or reduced accumulation of joule heating, particularly at the corner portion of the metal pillar connecting to a bonding pad (or a trace).

Figure 1A:
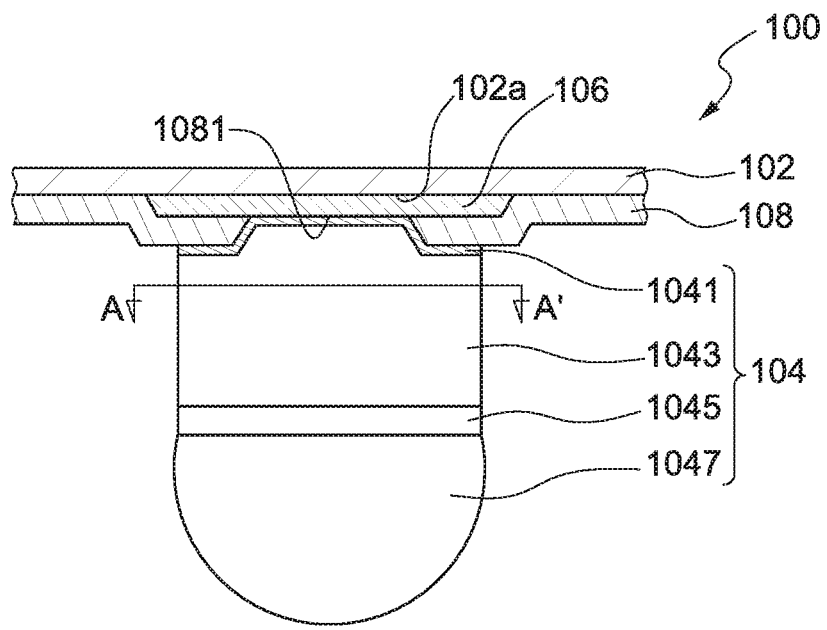
FIG. 1A illustrates a cross-sectional view of a semiconductor device according to an embodiment of the present disclosure.

FIG. 1A illustrates a cross-sectional view of a semiconductor device 100 according to an embodiment of the present disclosure. The semiconductor device 100 of FIG. 1A includes a semiconductor element 102, multiple pillar structures including a pillar structure 104, and a first insulation layer 108.

The semiconductor element 102 may be a chip, a package, or an interposer. The semiconductor element 102 has a first surface 102a and one or more bonding pads 106. The bonding pad 106 is disposed adjacent to the first surface 102a of the semiconductor element 102. The bonding pad 106 may be, for example, a contact pad of a trace. In the embodiment of FIG. 1A, the first surface 102a is an active surface, the bonding pad 106 is a contact pad, and the bonding pad 106 is disposed directly on the first surface 102a of the semiconductor element 102. The bonding pad 106 may include, for example, one of, or a combination of, copper, gold, indium, tin, silver, palladium, osmium, iridium, ruthenium, titanium, magnesium, aluminum, cobalt, nickel, or zinc, or other metals or metal alloys.

The first insulation layer 108 is disposed adjacent to the first surface 102a of the semiconductor element 102. In the embodiment of FIG. 1A, the first insulation layer 108 is disposed directly on the first surface 102a of the semiconductor element 102 to cover a portion of the bonding pad 106 and the first surface 102a of the semiconductor element 102. The first insulation layer 108 defines one or more openings 1081. Each opening 1081 corresponds to a respective bonding pad 106 and exposes at least a portion of the bonding pad 106. The first insulation layer 108 may be a passivation layer (the material of which may be silicon oxide or silicon nitride, or another insulation material).

The pillar structure 104 is a conductive column structure. The pillar structure 104 illustrated in FIG. 1A is disposed on the exposed portion of the illustrated bonding pad 106 and on the first insulation layer 108. As seen in FIG. 1A, the pillar structure 104 includes an under bump metallization (UBM) layer 1041, a pillar 1043, a barrier layer 1045, and a solder layer 1047. In some embodiments, one or both of the barrier layer 1045 and the solder layer 1047 are omitted from the pillar structure 104.

Figure 1B:
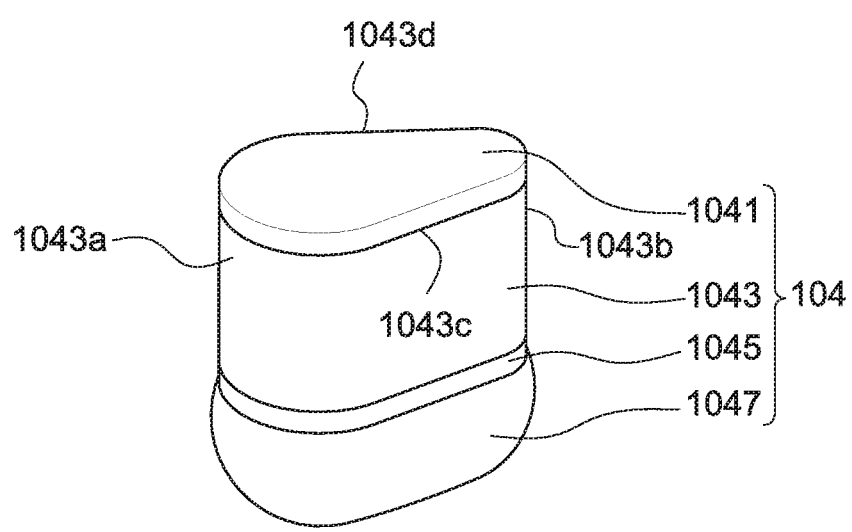
FIG. 1B illustrates a perspective view of a pillar structure of the semiconductor device illustrated in FIG. 1A according to an embodiment of the present disclosure.

FIG. 1B illustrates a perspective view of the pillar structure 104 of FIG. 1A. FIG. 1B shows an outer boundary of the pillar structure 104, illustrating that outer boundaries of the included UBM layer 1041, pillar 1043, barrier layer 1045, and solder layer 1047 before solder reflow are the same (e.g., within manufacturing tolerances).

The pillar 1043 has a first end wall 1043a, a second end wall 1043b opposite the first end wall 1043a, a first side wall 1043c, and a second side wall 1043d opposite the first side wall 1043c. The first side wall 1043c and the second side wall 1043d connect the first end wall 1043a to the second end wall 1043b. One or both of the first side wall 1043c and the second side wall 1043d incline inwardly, or taper, from the first end wall 1043a to the second end wall 1043b, such that the first side wall 1043c and the second side wall 1043d are not parallel. Accordingly, the pillar 1043 will be wider towards, or adjacent, the first end wall 1043a than it is towards, or adjacent, the second end wall 1043b.

Figure 2:
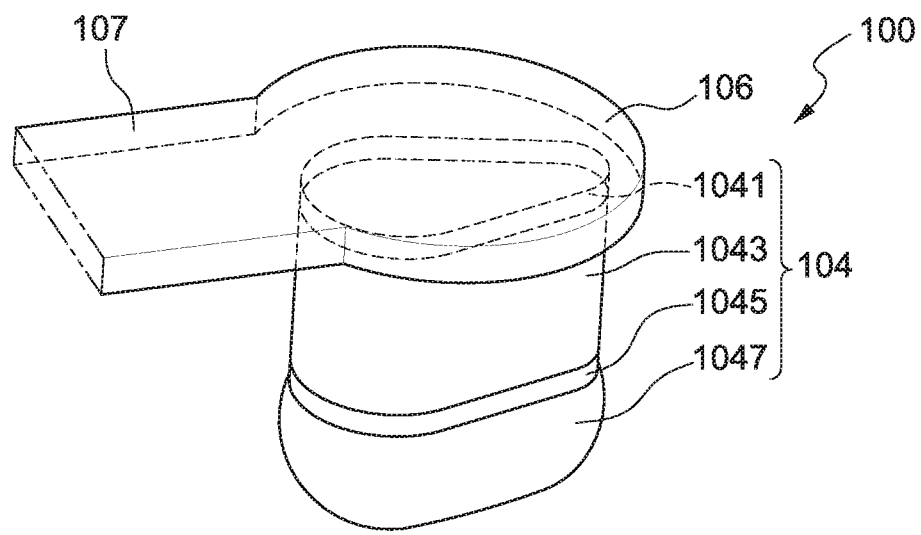
FIG. 2 illustrates a perspective view of the semiconductor device illustrated in FIG. 1A according to an embodiment of the present disclosure.

FIG. 2 illustrates a perspective view of the pillar structure 104 of FIG. 1A in relation to the bonding pad 106. As illustrated, the bonding pad 106 is a contact pad of a trace 107. In an embodiment, the pillar structure 104 may be vertically connected to the trace 107 by disposing the pillar structure 104 on the bonding pad 106. In the embodiment illustrated in FIG. 2, the wider portion of the pillar structure 104 (e.g., at the first end wall 1043a of the pillar 1043) is positioned towards the trace 107, so that current flowing in the trace 107 may flow through the wider portion of the pillar structure 104, and current crowding may be reduced at the portion of the pillar structure 104 connecting to the bonding pad 106. Therefore, the accumulation of joule heating and breakage of the pillar structure 104 or a solder connection can be reduced or eliminated, and the electrical connection may correspondingly be improved.

Figure 3:
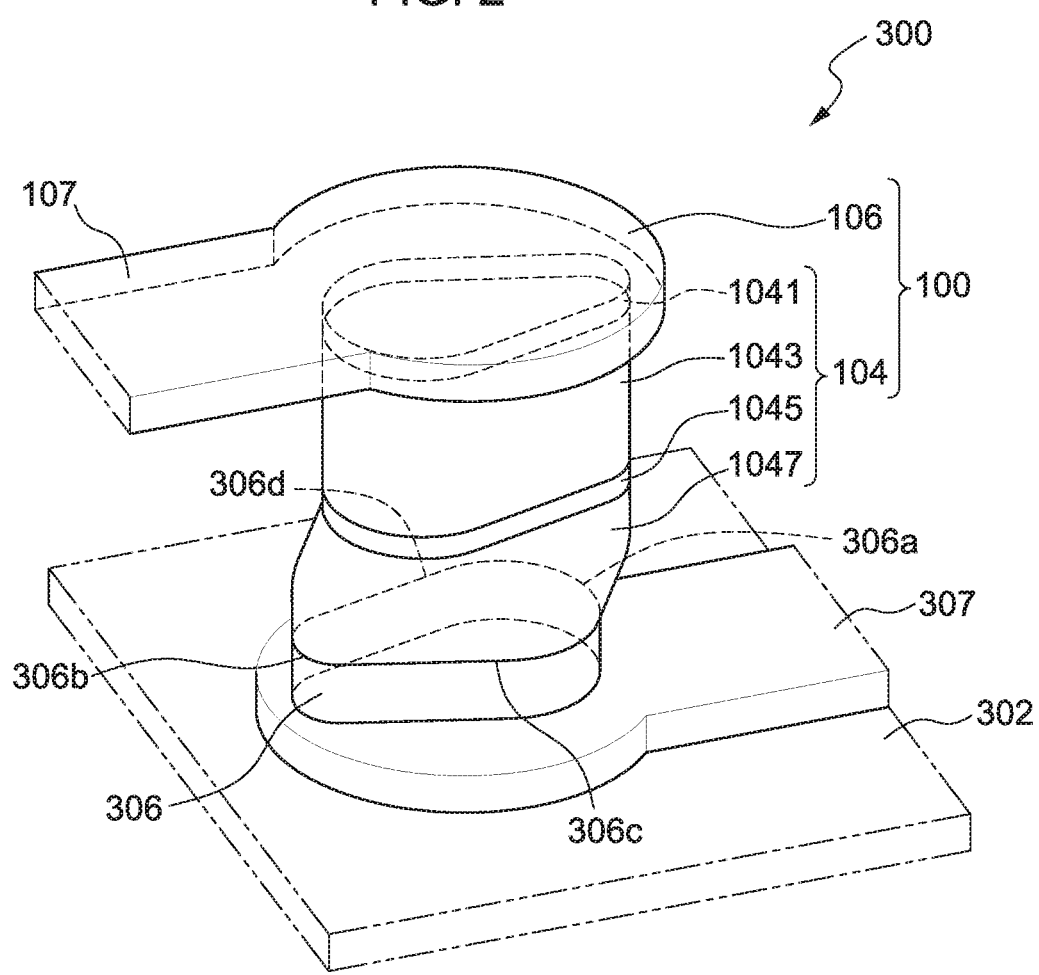
FIG. 3 illustrates a perspective view of a semiconductor package according to an embodiment of the present disclosure.

FIG. 3 illustrates a perspective view of an embodiment of a semiconductor package 300 including the semiconductor device 100 of FIG. 1A. The semiconductor package 300 of FIG. 3 includes the semiconductor device 100 of FIG. 1A and a second semiconductor element 302. Some features of the semiconductor device 100 are omitted from the illustration in FIG. 3 to highlight certain concepts of the semiconductor package 300. The second semiconductor element 302 may be a chip, a substrate, a package, or an interposer.

The second semiconductor element 302 includes one or more second bonding pads 306. The semiconductor device 100 may be electrically connected to the second semiconductor element 302 through the pillar structure 104 disposed on the semiconductor device 100 and through the second bonding pad 306 disposed on the second semiconductor element 302. The second bonding pad 306 connects to a trace 307 disposed adjacent to a surface of the second semiconductor element 302. The second bonding pad 306 may include, for example, one of, or a combination of, copper, gold, indium, tin, silver, palladium, osmium, iridium, ruthenium, titanium, magnesium, aluminum, cobalt, nickel, or zinc, or other metals or metal alloys.

The second bonding pad 306 includes a first end wall 306a, a second end wall 306b opposite the first end wall 306a, a first side wall 306c, and a second side wall 306d opposite the first side wall 306c. The first side wall 306c and the second side wall 306d connect the first end wall 306a to the second end wall 306b. One or both of the first side wall 306c and the second side wall 306d incline inwardly, or taper, from the first end wall 306a to the second end wall 306b, such that the first side wall 306c and the second side wall 306d are not parallel. Accordingly, the second bonding pad 306 will be wider towards, or adjacent, the first end wall 306a than it is towards, or adjacent, the second end wall 306b.

In the embodiment illustrated in FIG. 3, the wider portion of the second bonding pad 306 (e.g., at the first end wall 306a) is positioned towards the trace 307, so that current flowing in the trace 307 may flow through the wider portion of the second bonding pad 306, and current crowding may be reduced at the portion of the second bonding pad 306 connecting to the trace 307. Therefore, the accumulation of joule heating and breakage of the second bonding pad 306 or a solder connection can be reduced or eliminated, and the electrical connection may correspondingly be improved.

A cross-sectional shape and area of the second bonding pad 306 of FIG. 3 may be similar to a cross-sectional shape and area of the pillar 1043 or the pillar structure 104 of FIG. 1B, but is not necessarily so. In some embodiments, the cross-sectional shape and area of the second bonding pad 306 is different than the cross-sectional shape and area of the pillar 1043 or the pillar structure 104.

Figure 4:
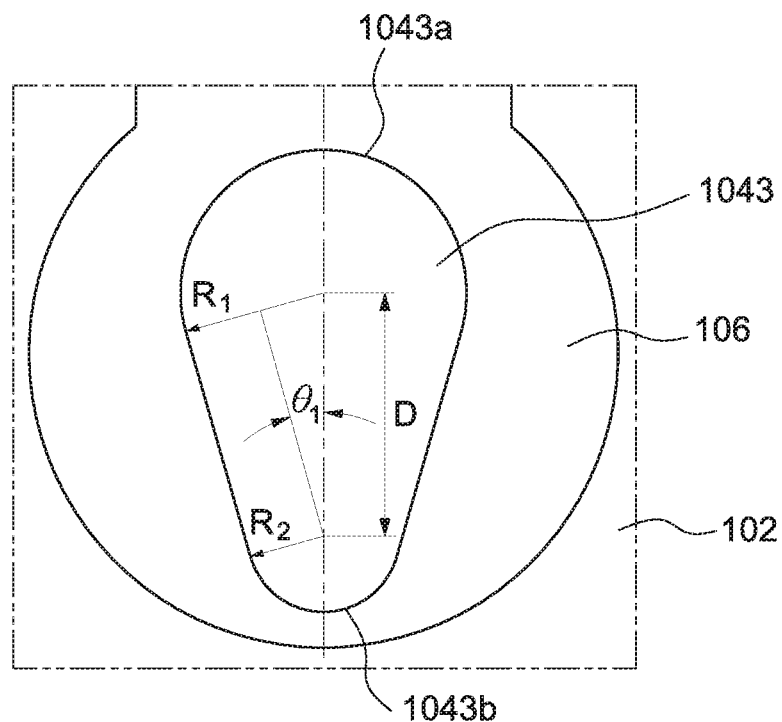
FIG. 4 illustrates a bottom view of the semiconductor device illustrated in FIG. 1A according to an embodiment of the present disclosure.

FIG. 4 illustrates a bottom view of an embodiment of the semiconductor device 100 of FIG. 1A, with the pillar structure 104 (including the pillar 1043) positioned on the bonding pad 106. The first end wall 1043a of the pillar 1043 is a convex wall including a first radius $R_1$ of curvature, and the second end wall 1043b of the pillar 1043 is a convex wall including a second radius $R_2$ of curvature. In this embodiment, the first radius $R_1$ of curvature is greater than the second radius $R_2$ of curvature.

In some embodiments, each of the first radius $R_1$ of curvature and the second radius $R_2$ of curvature describe a radius of a circle, such that a shape of the first end wall 1043a represents an arc of a first circle and the shape of the second end wall 1043b represents an arc of a second circle, and a relationship between $R_1$ and $R_2$ is defined by the following equation:

$$\theta_1 = \sin^{-1}((R_1 - R_2)/D)$$

where D represents a distance between an origin of the circle of radius $R_1$ and an origin of the circle of radius $R_2$. In some embodiments, the angle $\theta_1$ can be from 0° to about 45°, from 0° to about 40°, from 0° to about 35°, from 0° to about 30°, from 0° to about 25°, from 0° to about 20°, from 0° to about 15°, from 0° to about 10°, or from 0° to about 5°. In some embodiments, a ratio of $R_1$ to $R_2$ is greater than 1:1. In some embodiments, a ratio of $R_1$ to $R_2$ is from about 1.1:1 to about 2.5:1, from about 1.2:1 to about 2.4:1, from about 1.3:1 to about 2.3:1, from about 1.4:1 to about 2.2:1, or from about 1.5:1 to about 2.1:1. In some embodiments, a ratio of $R_1$ to $R_2$ is about 1.1:1, about 1.2:1, about 1.3:1, about 1.4:1, about 1.5:1, about 1.6:1, about 1.7:1, about 1.8:1, about 1.9:1, about 2:1, about 2.1:1, about 2.2:1, about 2.3:1, about 2.4:1, or about 2.5:1.

For an embodiment of the semiconductor device 100 similar to that illustrated in FIG. 4, effects of varying the ratio of $R_1$ to $R_2$ on a current density of a pillar is as shown in Table 1. The "current density ratio" in the right column of Table 1 refers to a comparison of a pillar having the $R_1:R_2$ ratio given in the left column of Table 1 to a pillar having an $R_1:R_2$ ratio of 1:1 (a pillar with an oval or circular shape). Accordingly, for a pillar with an $R_1:R_2$ ratio of 1:1 as shown in the left column for the first entry of the table, the current density ratio is 1.

TABLE 1

| $R_1:R_2$ ratio | Current density ratio |
|---|---|
| 1:1 | 1 |
| 1.2:1 | 0.87 |
| 1.5:1 | 0.85 |
| 2:1 | 0.47 |

The current density results shown in Table 1 were obtained by computer simulation of a model of a pillar (e.g., pillar 1043), where the current density was represented by vectors, and the model of the pillar was tested by applying a (simulated) voltage to one end of the pillar and forcing the voltage at the other end of the pillar to be zero (grounded). In this manner, a current density distribution in the pillar was obtained for different $R_1:R_2$ ratios. From the distribution it can be identified where the current density is greatest.

Simulation of a traditional pillar (circular or oval) indicated that the corners connecting the trace to the pillars tend to have the greatest current density, as shown in Table 1 for a pillar having a ratio $R_1:R_2$ of 1:1 (a pillar in a circular or oval shape).

From Table 1 it can be seen that the current density ratio decreases as the ratio of $R_1$ to $R_2$ increases. That is, by designing the pillar (e.g., 1043) to have a wider end (e.g., at the first end wall 1043a) toward the trace 107, current crowding generated in the pillar can be reduced. It can further be seen from Table 1 that a reduction of approximately 53% in current density ratio may be achieved using a ratio of $R_1$ to $R_2$ of about 2:1 as compared to a ratio of $R_1$ to $R_2$ of 1:1.

Similarly, referring back to FIG. 3, current crowding in the second bonding pad 306 can be reduced by increasing a width of the second bonding pad 306 towards the first end wall 306a relative to a width of the second bonding pad 306 towards the second end wall 306b, and positioning the wider portion of the second bonding pad 306 towards the trace 307.

Figure 5:
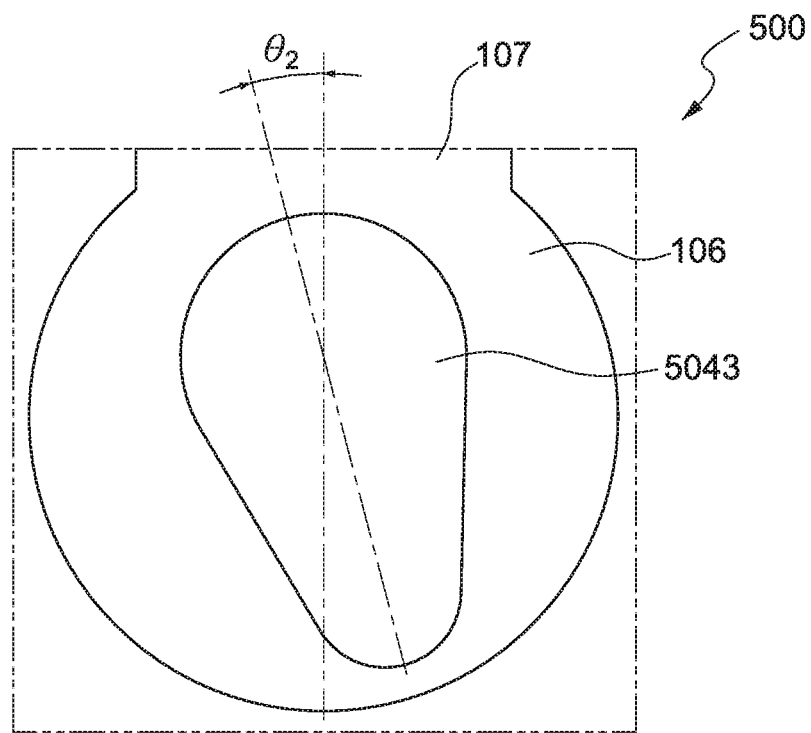
FIG. 5 illustrates a bottom view of a semiconductor device according to an embodiment of the present disclosure.

FIG. 5 illustrates a bottom view of an embodiment of a semiconductor device 500 in which a pillar structure including a pillar 5043 is positioned over a bonding pad 106. The semiconductor device 500 is similar to that illustrated in FIG. 4, with a difference being that the pillar 5043 in FIG. 5 is rotated in a horizontal direction with respect to the bonding pad 106 or the trace 107 as compared to the pillar 1043 in FIG. 4. Referring to FIG. 4, a dot-dash line shows a center line of the pillar 1043, which is also a center line of the bonding pad 106 and a center line of the trace 107. Comparing to FIG. 5, a first dot-dash line shows a center line of the pillar 5043 and a second dot-dash line shows the center line of the bonding pad 106 and the trace 107, and an angle $\theta_2$ is formed between the two center lines. In some embodiments, the angle $\theta_2$ can be from 0° to about 45°, from 0° to about 40°, from 0° to about 35°, from 0° to about 30°, from 0° to about 25°, from 0° to about 20°, from 0° to about 15°, from 0° to about 10°, or from 0° to about 5°. In some embodiments, the angle $\theta_2$ can be greater than 0° and within the previously stated ranges. As can be seen in FIG. 5, even though the pillar 5043 is rotated by the angle $\theta_2$, a portion of the pillar 5043 facing the trace 107 is wider than the narrowest portion of the pillar 5043, and current crowding is reduced (e.g., as compared to a pillar of consistent width along its length).

Similarly, referring back to FIG. 3, the second bonding pad 306 may be rotated with respect to a central line of the trace 307, and a reduction of current crowding may still be achieved. In some embodiments, an angle of rotation of the second bonding pad 306 with respect to the central line of the trace 307 is equal to or less than about 45°, such as from 0° to about 45°, from 0° to about 40°, from 0° to about 35°, from 0° to about 30°, from 0° to about 25°, from 0° to about 20°, from 0° to about 15°, from 0° to about 10°, or from 0° to about 5°. In some embodiments, the angle of rotation can be greater than 0° and within the previously stated ranges.

Still referring back to FIG. 3, and considering the discussion above related to rotation of the pillar 5043 and rotation of the second bonding pad 306, it should be understood that one or both of the pillar 1043 and the second bonding pad 306 of FIG. 3 may be rotated with respect to the traces 107, 307, respectively. Further, an angle of rotation of the pillar 1043 with respect to the bonding pad 107 may be similar to, or may be different from, the angle of rotation of the second bonding pad 306 with respect to the trace 307. Additionally, the traces 107, 307 may extend in different directions with respect to each other from the pillar structure 104 and the bonding pad 306 (e.g., approximately 180° different in FIG. 3). Therefore, a displacement angle may occur between a center line of the pillar 1043 and a center line of the second bonding pad 306 (e.g., approximately 180° in FIG. 3).

The pillar structure 104 of FIG. 1A can have a cross-sectional shape different from the cross-sectional shape illustrated in bottom view in FIG. 4. Some examples are provided in FIGS. 6-10, illustrating cross-sections along a line AA' in FIG. 1A.

Figure 6:
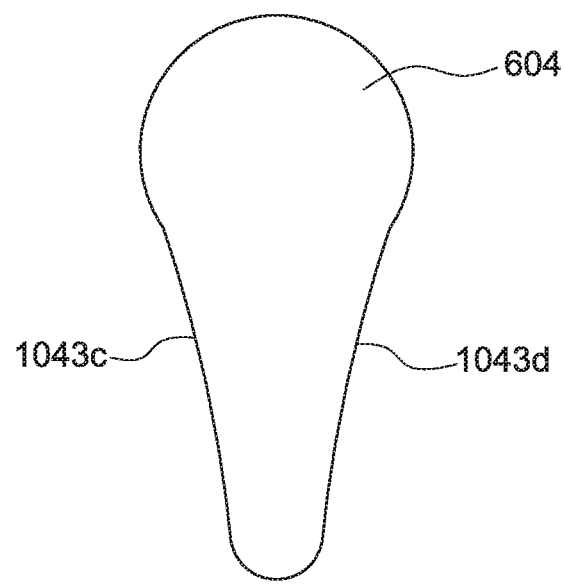
FIG. 6 illustrates a cross-sectional view of a pillar according to an embodiment of the present disclosure.

FIG. 6 illustrates a cross-sectional view of a pillar structure 604 in accordance with an embodiment of the present disclosure. An outer boundary of the pillar structure 604 is similar to the outer boundary illustrated in the embodiment of FIG. 4, with a difference being that both the first side wall 1043c and the second side wall 1043d are concave. In other embodiments, one of the first side wall 1043c and the second side wall 1043d is concave and the other is not.

Figure 7:
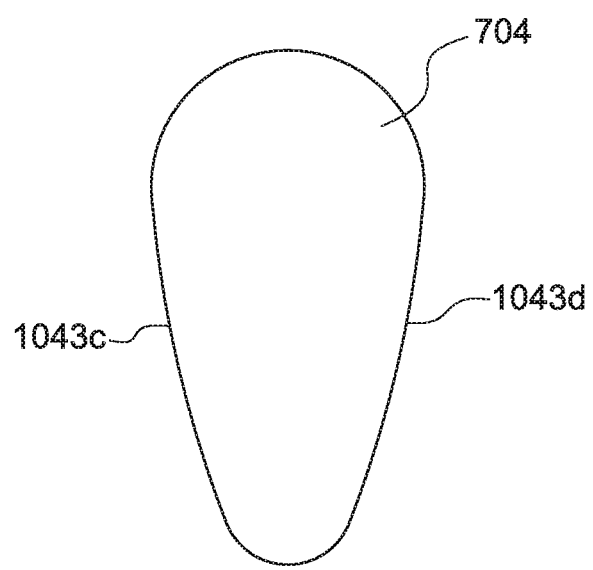
FIG. 7 illustrates a cross-sectional view of a pillar according to an embodiment of the present disclosure.

FIG. 7 illustrates a cross-sectional view of a pillar structure 704 in accordance with an embodiment of the present disclosure. An outer boundary of the pillar structure 704 is similar to the outer boundary illustrated in the embodiment of FIG. 4, with a difference being that both the first side wall 1043c and the second side wall 1043d are convex. In other embodiments, one of the first side wall 1043c and the second side wall 1043d is convex and the other is not.

Figure 8:
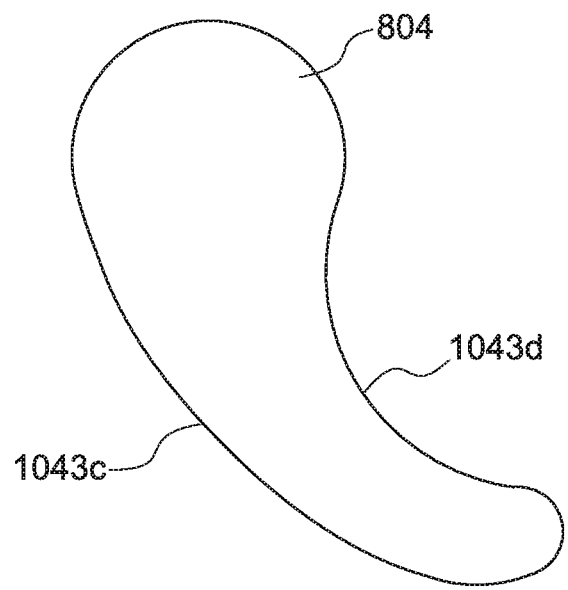
FIG. 8 illustrates a cross-sectional view of a pillar according to an embodiment of the present disclosure.

FIG. 8 illustrates a cross-sectional view of a pillar structure 804 in accordance with an embodiment of the present disclosure. An outer boundary of the pillar structure 804 is similar to the outer boundary illustrated in the embodiment of FIG. 4, with a difference being that the first side wall 1043c and the second side wall 1043d are curved in a same direction.

Figure 9:
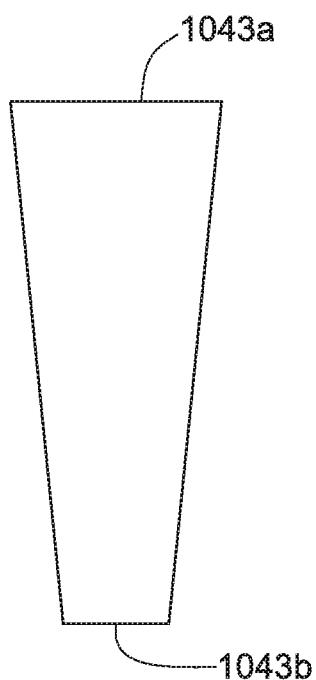
FIG. 9 illustrates a cross-sectional view of a pillar according to an embodiment of the present disclosure.

FIG. 9 illustrates a cross-sectional view of a pillar structure 904 in accordance with an embodiment of the present disclosure. An outer boundary of the pillar structure 904 is similar to the outer boundary illustrated in the embodiment of FIG. 4, with a difference being that the first end wall 1043a and the second end wall 1043b are substantially flat (e.g., not rounded).

Figure 10:
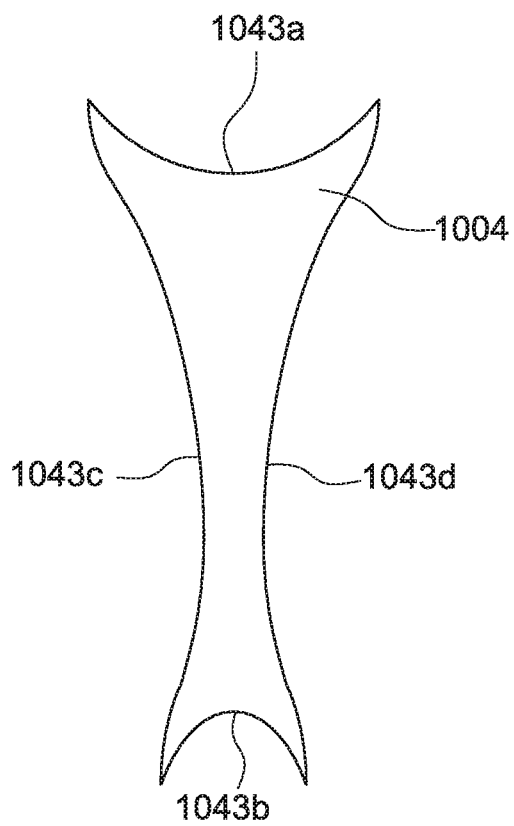
FIG. 10 illustrates a cross-sectional view of a pillar according to an embodiment of the present disclosure.

FIG. 10 illustrates a cross-sectional view of a pillar structure 1004 in accordance with an embodiment of the present disclosure. An outer boundary of the pillar structure 1004 is similar to the outer boundary illustrated in the embodiment of FIG. 4, with a difference being that the first end wall 1043a, the second end wall 1043b, the first side wall 1043c, and the second side wall 1043d are each concave.

Figure 11:
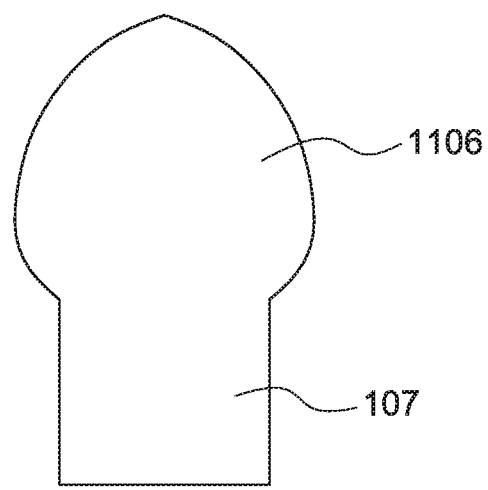
FIG. 11 illustrates a top view of a bonding pad and a portion of a trace according to an embodiment of the present disclosure.

FIG. 11 illustrates a top view of a bonding pad 1106 of the trace 107 in accordance with an embodiment of the present disclosure. An outer boundary of the bonding pad 1106 is similar to an outer boundary of the bonding pad 106 illustrated and described with respect to the embodiment of FIG. 4, with a difference being that the bonding pad 1106 is narrowed and has a spade-like shape, to reduce a space occupied by the bonding pad 1106 and to reduce material costs.

It should be noted that the technical features disclosed above can be combined together without departing from the merits of the present disclosure.

Figure 12:
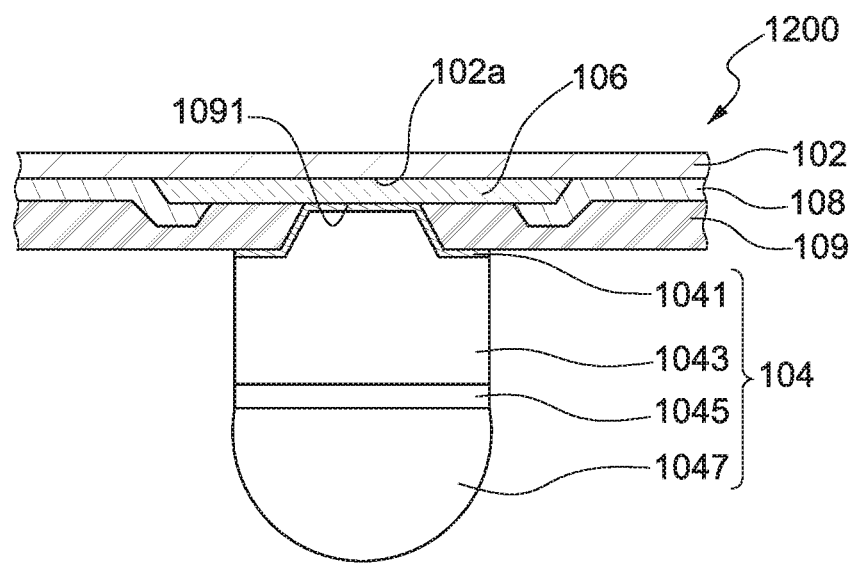
FIG. 12 illustrates a cross-sectional view of a semiconductor device according to an embodiment of the present disclosure.

FIG. 12 illustrates a cross-sectional view of a semiconductor device 1200 according to an embodiment of the present disclosure. The semiconductor device 1200 of FIG. 12 is similar to the semiconductor device 100 of FIG. 1A, with a difference being that a second insulation layer 109 is disposed adjacent to the first surface 102a of the semiconductor element 102. The second insulation layer 109 covers the first insulation layer 108 and a portion of the bonding pad 106. The second insulation layer 109 defines one or more first openings 1091. Each first opening 1091 corresponds to a respective bonding pad 106 and exposes at least a portion of the bonding pad 106. The second insulation layer 109 may be an organic insulating layer, the material of which is, for example, a polyimide (PI) or other polymer.

Figure 13:
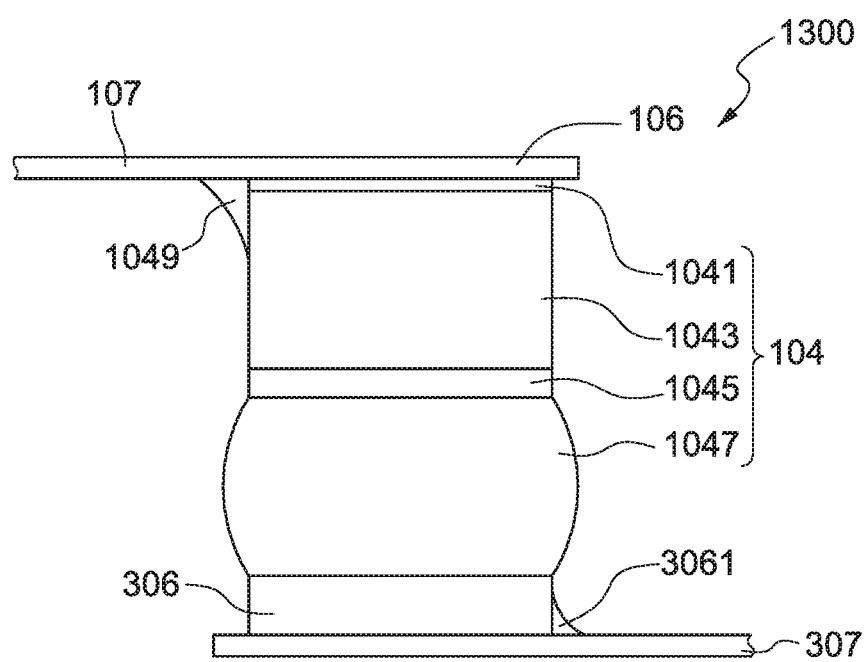
FIG. 13 illustrates a cross-sectional view of a semiconductor package according to an embodiment of the present disclosure.

FIG. 13 illustrates a cross-sectional view of a semiconductor package 1300 according to an embodiment of the present disclosure. The semiconductor package 1300 of FIG. 13 is similar to that illustrated and described with reference to the embodiment of FIG. 3, with a difference being that the pillar structure 104 further includes an extended portion 1049 along a portion of a corner of the pillar structure 104 facing the trace 107, to reduce current crowding and improve current flow at the corner of the pillar 1043. In some embodiments, the second bonding pad 306 may also include an extended portion 3061 along a portion of a corner of the second bonding pad 306 facing the trace 307, to reduce current crowding and improve current flow at the corner of the second bonding pad 306.

FIGS. 14A-14G illustrate a manufacturing method in accordance with an embodiment of the present disclosure.

Figure 14A:
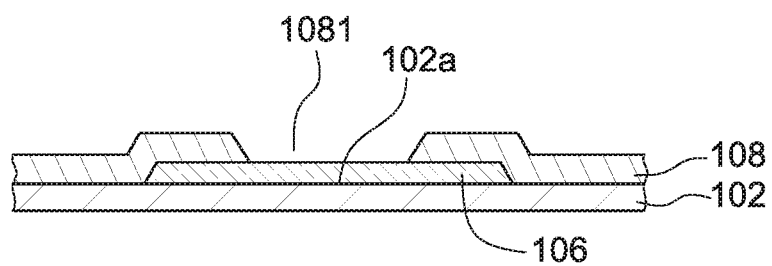
FIG. 14A, FIG. 14B, FIG. 14C, FIG. 14D, FIG. 14E, FIG. 14F and FIG. 14G illustrate a manufacturing method in accordance with an embodiment of the present disclosure.

Referring to FIG. 14A, a semiconductor element 102 is provided. The semiconductor element 102 includes a first surface 102a and one or more bonding pads 106. The bonding pad 106 is formed on an active surface of the semiconductor element 102. A first insulation layer 108 is formed to cover a portion of the bonding pad 106 and the first surface 102a of the semiconductor element 102. The first insulation layer 108 defines one or more openings 1081. A portion of the bonding pad 106 is exposed by the first insulation layer 108.

Figure 14B:
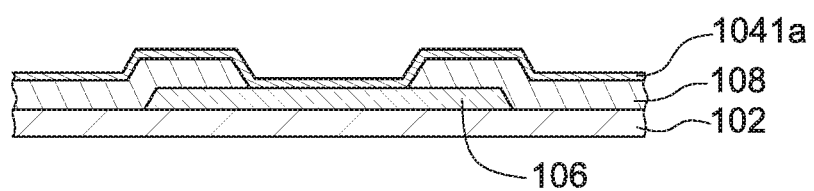

Referring to FIG. 14B, a metal layer 1041a is formed on the first insulation layer 108 and the exposed portion of the bonding pad 106. The metal layer 1041a may be formed, for example, by a sputtering technique. The metal layer 1041a may include, but is not limited to, copper, titanium, tungsten, an alloy thereof, or another suitable metal or alloy.

Figure 14C:
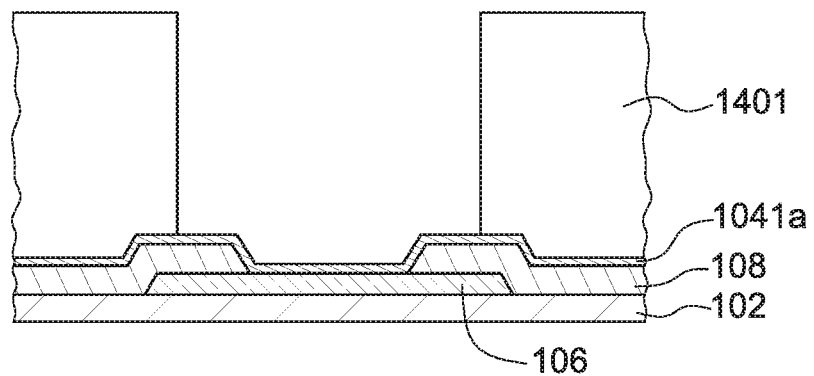

Referring to FIG. 14C, a patterned mask 1401 is formed on the metal layer 1041a to expose a portion of the metal layer 1041a. The exposed portion of the metal layer 1041a may have an outer boundary similar to that of the pillar structure 104 as illustrated and described with reference to the embodiments of FIG. 4 or FIGS. 6-10. The patterned mask 1401 may be formed, for example, by a photolithography technique.

Figure 14D:
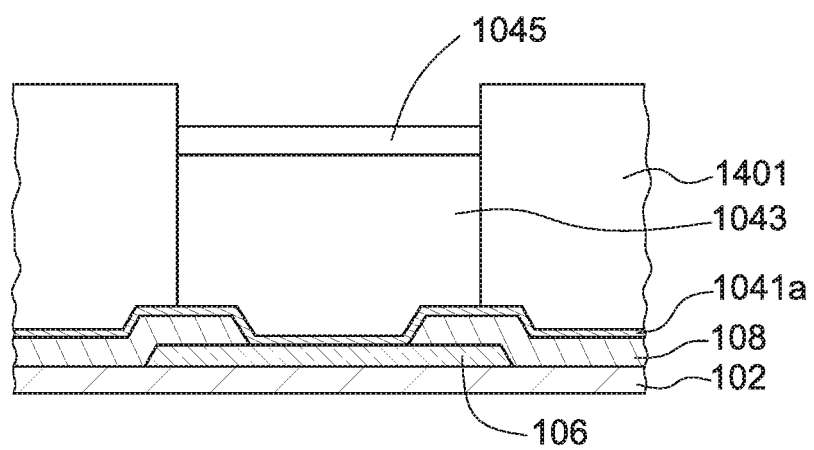

Referring to FIG. 14D, a metal pillar 1043 is formed on the exposed portion of the metal layer 1041a, and a barrier layer 1045 is formed on the metal pillar 1043. The metal pillar 1043 and the barrier layer 1045 may be formed, for example, by a plating technique. The metal pillar 1043 may include, but is not limited to, copper or another suitable metal or an alloy thereof. The barrier layer 1045 may include, but is not limited to, nickel, copper, an alloy thereof, or another suitable metal or alloy.

Figure 14E:
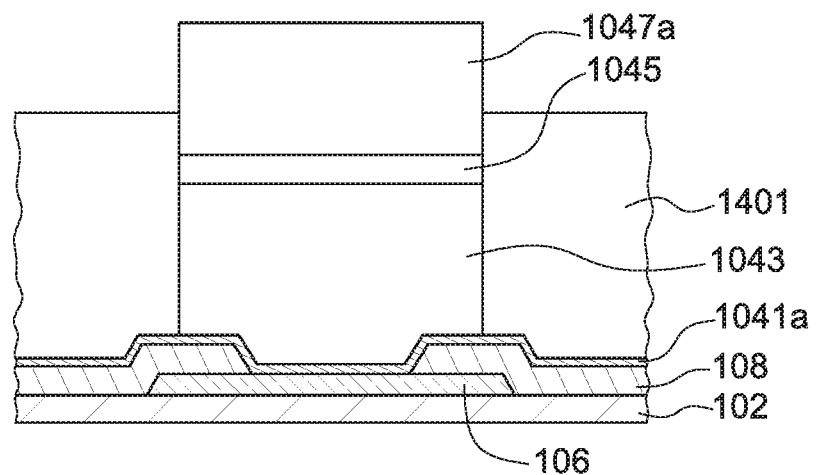

Referring to FIG. 14E, a solder layer 1047a is formed on the barrier layer 1045. The solder layer 1047a may be formed, for example, using photolithography and etching techniques.

Figure 14F:
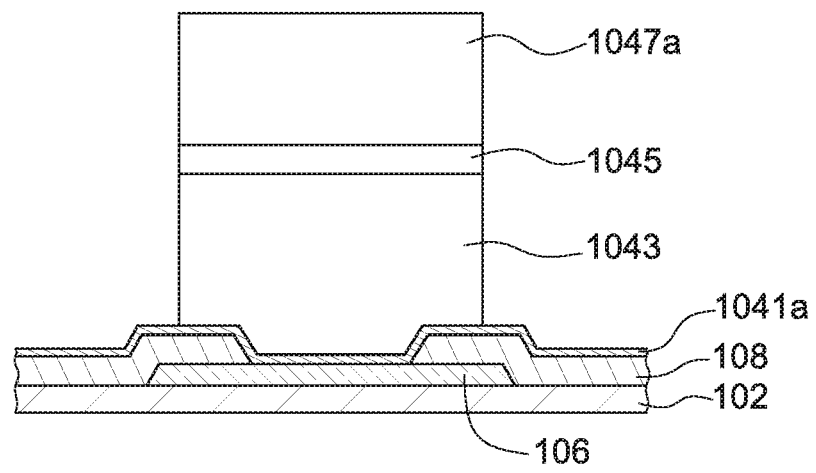

Referring to FIG. 14F, the patterned mask 1401 is removed.

Figure 14G:
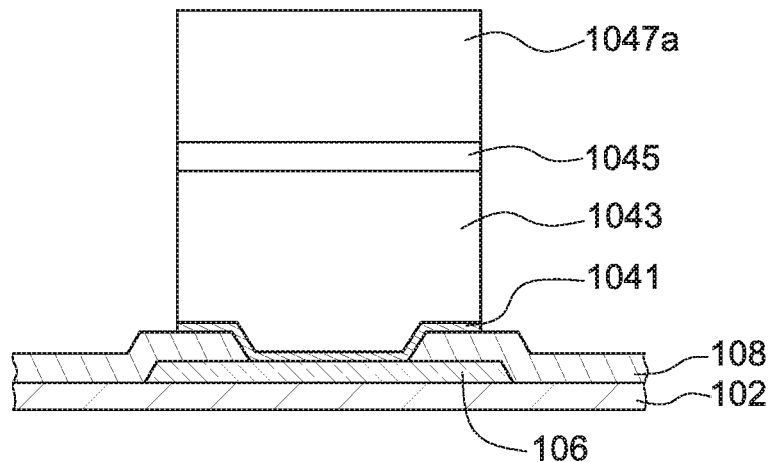

Referring to FIG. 14G, a portion of the metal layer 1041a not covered by the metal pillar 1043 is removed to form a UBM layer 1041. The portion of the metal layer 1041a may be removed, for example, by an etching technique. Then, the solder layer 1047a is reflowed to form a semiconductor device 100 as illustrated in FIG. 1A.

FIGS. 15A-15H illustrate a manufacturing method in accordance with an embodiment of the present disclosure.

Figure 15A:
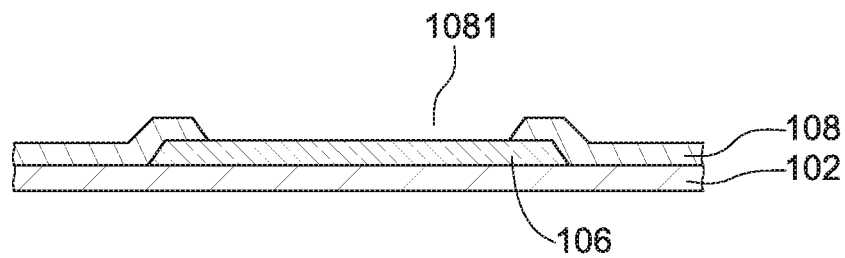
FIG. 15A, FIG. 15B, FIG. 15C, FIG. 15D, FIG. 15E, FIG. 15F, FIG. 15G, and FIG. 15H illustrate a manufacturing method in accordance with an embodiment of the present disclosure.

Referring to FIG. 15A, a semiconductor element 102 is provided. The semiconductor element 102 includes a first surface 102a and one or more bonding pads 106. The bonding pad 106 is formed on an active surface of the semiconductor element 102. A first insulation layer 108 is formed to cover to cover a portion of the bonding pad 106 and the first surface 102a of the semiconductor element 102. The first insulation layer 108 defines one or more openings 1081. A portion of the bonding pad 106 is exposed by the first insulation layer 108.

Figure 15B:
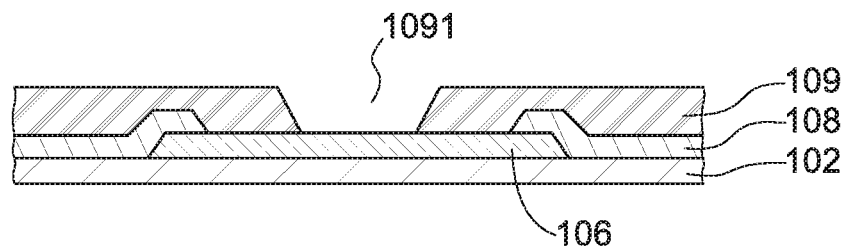

Referring to FIG. 15B, a second insulation layer 109 is disposed on the first insulation layer 108 and the bonding pad 106. The second insulation layer 109 defines one or more openings 1091. A portion of the bonding pad 106 is exposed by the second insulation layer 109. The second insulation layer 109 may include, but is not limited to, a polyimide or other suitable material that may provide stress absorption during assembly operation.

Figure 15C:
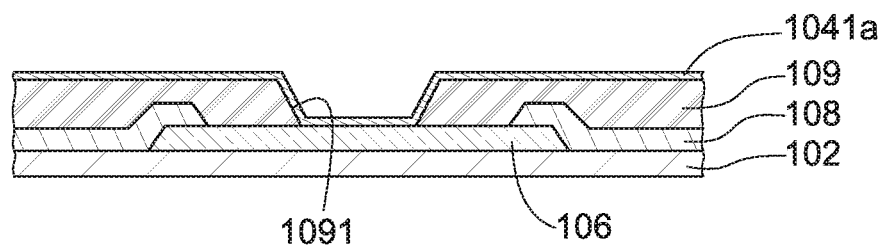

Referring to FIG. 15C, a metal layer 1041a is formed on the second insulation layer 109 and the exposed portion of the bonding pad 106. The metal layer 1041a may be formed, for example, by a sputtering technique. The metal layer 1041a may include, but is not limited to, copper, titanium, an alloy thereof, or another suitable metal or alloy.

Figure 15D:
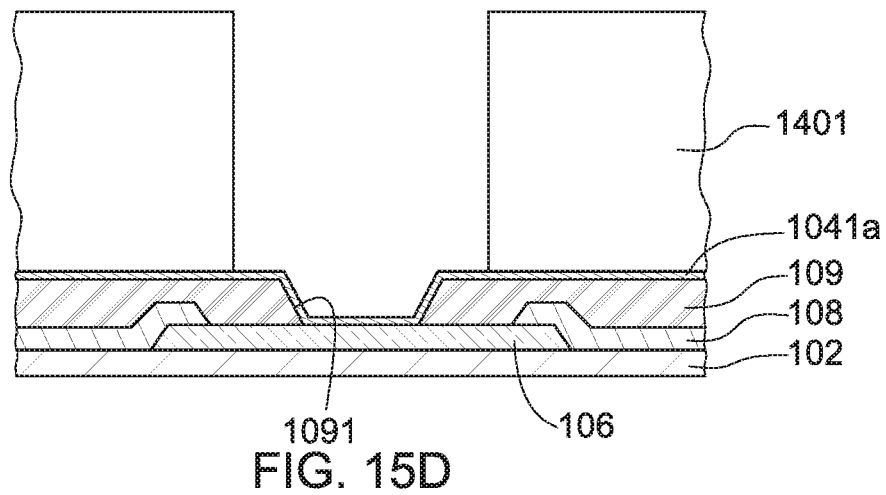

Referring to FIG. 15D, a patterned mask 1401 is formed on the metal layer 1041a to expose a portion of the metal layer 1041a. The exposed portion of the metal layer 1041a may have an outer boundary similar to that of the pillar structure 104 as illustrated and described with reference to the embodiments of FIG. 4 or FIGS. 6-10. The patterned mask 1401 may be formed, for example, by a photolithography technique.

Figure 15E:
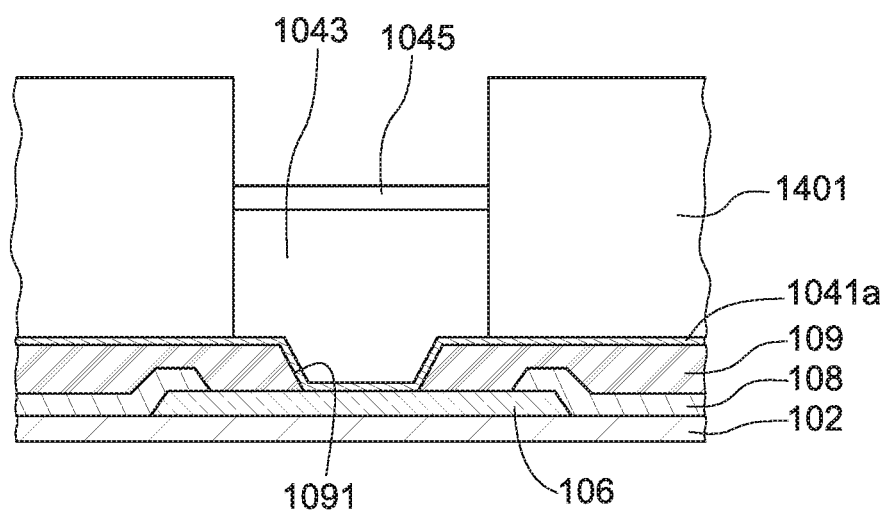

Referring to FIG. 15E, a metal pillar 1043 is formed on the exposed portion of the metal layer 1041a, and a barrier layer 1045 is formed on the metal pillar 1043. The metal pillar 1043 and the barrier layer 1045 may be formed, for example, by a plating technique. The metal pillar 1043 may include, but is not limited to, copper or another suitable metal, or an alloy thereof. The barrier layer 1045 may include, but is not limited to, nickel, an alloy thereof, or another suitable metal or alloy.

Figure 15F:
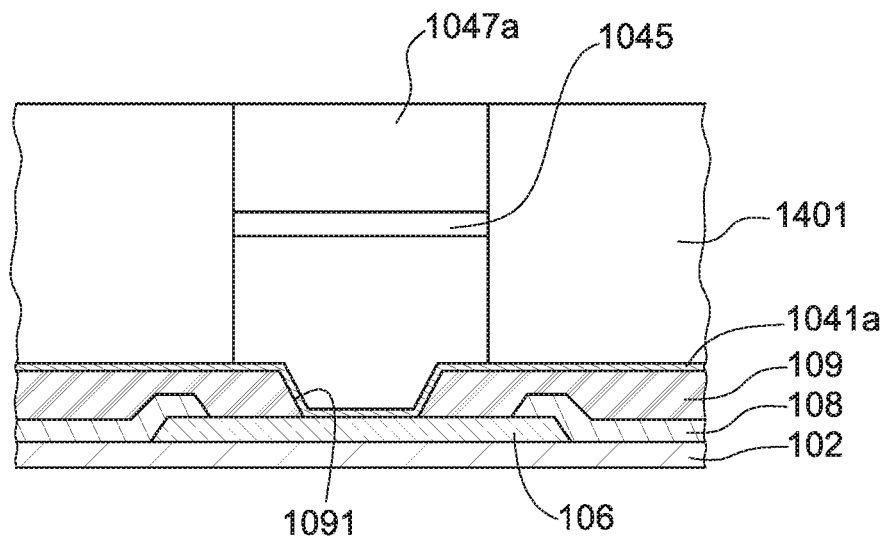

Referring to FIG. 15F, a solder layer 1047a is formed on the barrier layer 1045. The solder layer 1047a may be formed, for example, using photolithography and etching techniques.

Figure 15G:
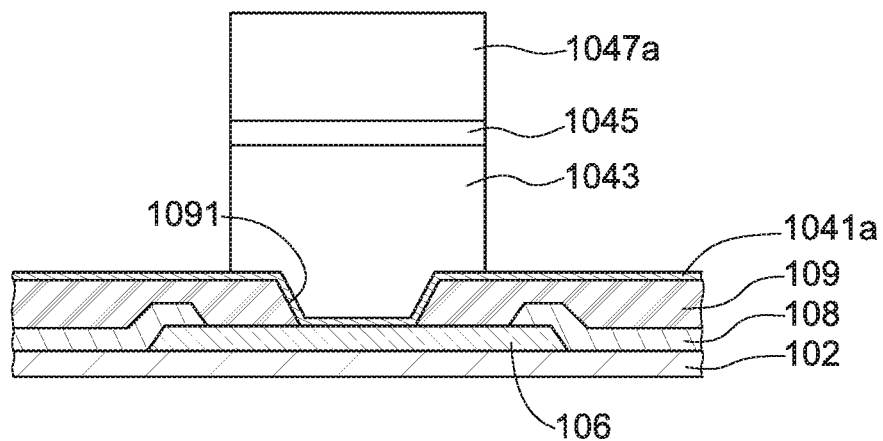

Referring to FIG. 15G, the patterned mask 1401 is removed.

Figure 15H:
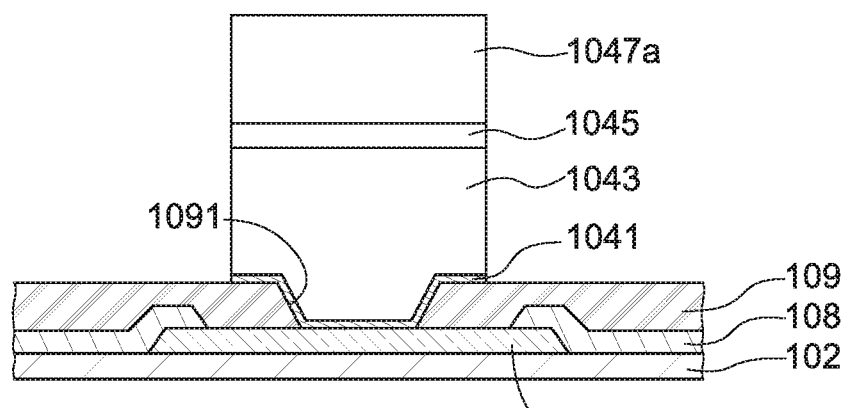

Referring to FIG. 15H, a portion of the metal layer 1041a not covered by the metal pillar 1043 is removed to form a UBM layer 1041. The portion of the metal layer 1041a may be removed, for example, by an etching technique. Then, the solder layer 1047a is reflowed to form a semiconductor device 1200 as illustrated in FIG. 12.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a line or a plane can be substantially flat if a peak or depression of the line or plane is no greater than 5 μm, no greater than 1 μm, or no greater than 0.5 μm.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor package, comprising:
   a semiconductor element;
   a substrate; and
   a trace disposed adjacent to a surface of the substrate and including a bonding pad, wherein the bonding pad is a contact pad of the trace; and
   the bonding pad including:
      a first end wall,
      a second end wall opposite the first end wall,
      a first side wall, and
      a second side wall opposite the first side wall, wherein the first side wall and the second side wall connect the first end wall to the second end wall, and the first end wall is wider than the second end wall;

wherein the first end wall is closer to the trace than is the second end wall, and the first end wall includes a sloped portion.

2. The semiconductor package of claim 1, wherein the first end wall is a convex wall comprising a first radius of curvature and the second end wall is a convex wall comprising a second radius of curvature, wherein the first radius of curvature is greater than the second radius of curvature.

3. The semiconductor package of claim 1, wherein a shape of the first end wall represents an arc of a first circle and a shape of the second end wall represents an arc of a second circle.

4. The semiconductor package of claim 3, wherein the first circle has a first radius $R_1$ and the second circle has a second radius $R_2$, and wherein a relationship between $R_1$ and $R_2$ is specified by the following equation:

$\theta_1 = \sin^{-1}((R_1 - R_2)/D)$ wherein the angle $\theta_1$ is from 0° to about 45° and D represents a distance between an origin of the first circle and an origin of the second circle.

5. The semiconductor package of claim 4, wherein a ratio of $R_1$ to $R_2$ is greater than 1:1.

6. The semiconductor package of claim 4, wherein a ratio of $R_1$ to $R_2$ is from about 1.1:1 to about 2.5:1.

7. The semiconductor package of claim 1, wherein a center line of the bonding pad along a length of the bonding pad forms an angle $\theta_2$ with a center line of the trace.

8. The semiconductor package of claim 7, wherein the angle $\theta_2$ is from 0° to about 45°.

9. The semiconductor package of claim 1, wherein one or both of the first side wall and the second side wall are convex.

10. The semiconductor package of claim 1, wherein one or both of the first side wall and the second side wall incline inwardly, or taper, from the first end wall to the second end wall, such that the first side wall and the second side wall are not parallel.

11. A substrate, comprising:
a trace disposed adjacent to a surface of the substrate and including a bonding pad, wherein the bonding pad is a contact pad of the trace; and
the bonding pad including:
a first end wall,
a second end wall opposite the first end wall,
a first side wall, and
a second side wall opposite the first side wall,
wherein the first side wall and the second side wall connect the first end wall to the second end wall, and the first end wall is wider than the second end wall;
wherein the first end wall is closer to the trace than is the second end wall, and the first end wall includes a sloped portion.

12. The substrate of claim 11, wherein the first end wall is a convex wall comprising a first radius of curvature and the second end wall is a convex wall comprising a second radius of curvature, wherein the first radius of curvature is greater than the second radius of curvature.

13. The substrate of claim 11, wherein a shape of the first end wall represents an arc of a first circle and a shape of the second end wall represents an arc of a second circle.

14. The substrate of claim 13, wherein the first circle has a first radius $R_1$ and the second circle has a second radius $R_2$, and wherein a relationship between $R_1$ and $R_2$ is specified by the following equation:

$\theta_1 = \sin^{-1}((R_1 - R_2)/D)$ wherein the angle $\theta_1$ is from 0° to about 45° and D represents a distance between an origin of the first circle and an origin of the second circle.

15. The substrate of claim 14, wherein a ratio of $R_1$ to $R_2$ is greater than 1:1.

16. The substrate of claim 14, wherein a ratio of $R_1$ to $R_2$ is from about 1.1:1 to about 2.5:1.

17. The substrate of claim 11, wherein a center line of the bonding pad along a length of the bonding pad forms an angle $\theta_2$ with a center line of the trace.

18. The substrate of claim 17, wherein the angle $\theta_2$ is from 0° to about 45°.

19. The substrate of claim 18 wherein one or both of the first side wall and the second side wall incline inwardly, or taper, from the first end wall to the second end wall, such that the first side wall and the second side wall are not parallel.

20. The substrate of claim 11, wherein one or both of the first side wall and the second side wall incline inwardly, or taper, from the first end wall to the second end wall, such that the first side wall and the second side wall are not parallel.

* * * * *